(12) United States Patent
Okamoto et al.

(10) Patent No.: US 7,567,020 B2
(45) Date of Patent: Jul. 28, 2009

(54) LAMINATED PIEZOELECTRIC ELEMENT INCLUDING ADHESIVE LAYERS HAVING SMALL THICKNESS AND HIGH ADHESIVE STRENGTH

(75) Inventors: Shinichi Okamoto, Chiryu (JP); Hiroaki Asano, Kuwana (JP); Yoichi Kobane, Kuwana (JP)

(73) Assignee: Denso Corporation, Kariya (JP)

( * ) Notice: Subject to any disclaimer, the term of this patent is extended or adjusted under 35 U.S.C. 154(b) by 5 days.

(21) Appl. No.: 12/043,473

(22) Filed: Mar. 6, 2008

(65) Prior Publication Data

US 2008/0218032 A1  Sep. 11, 2008

(30) Foreign Application Priority Data

Mar. 7, 2007  (JP) .............................. 2007-056887

(51) Int. Cl.
  *H01L 41/08* (2006.01)
(52) U.S. Cl. ..................................... 310/328
(58) Field of Classification Search ......... 310/363–366, 310/328
  See application file for complete search history.

(56) References Cited

U.S. PATENT DOCUMENTS

| 3,159,601 | A | 12/1964 | Ashby |
| 3,159,662 | A | 12/1964 | Ashby |
| 3,220,972 | A | 11/1965 | Lamoreaux |
| 3,775,452 | A | 11/1973 | Karstedt |
| 5,089,739 | A | 2/1992 | Takahashi et al. |
| 7,339,310 | B2 * | 3/2008 | Kobane et al. ............... 310/366 |
| 2001/0047796 | A1 * | 12/2001 | Yamada et al. ............... 123/498 |

FOREIGN PATENT DOCUMENTS

| JP | 3-270085 | 12/1991 |
| JP | 4-274378 | 9/1992 |
| JP | 8-242024 | 9/1996 |
| JP | 11-214759 | 8/1999 |
| JP | 11-274590 | 10/1999 |
| JP | 2005-45086 | 2/2005 |
| JP | 2005045086 A * | 2/2005 |
| JP | 2005-340585 | 12/2005 |
| JP | 2006041279 A * | 2/2006 |
| JP | 2006-131813 | 5/2006 |

\* cited by examiner

*Primary Examiner*—Jaydi SanMartin
(74) *Attorney, Agent, or Firm*—Nixon & Vanderhye, PC

(57) ABSTRACT

A laminated piezoelectric element according to the present invention includes a plurality of unit laminates and a plurality of adhesive layers. The unit laminates are stacked together. Each of the unit laminates includes a plurality of piezoelectric ceramic layers and a plurality of internal electrode layers that are alternately laminated with the piezoelectric ceramic layers in the lamination direction of the unit laminate. Each of the adhesive layers is formed between adjacent two of the unit laminates to bond the two unit laminates together. Further, each of the adhesive layers has a thickness of 1 μm or less and an adhesive strength of 1.3 MPa or higher.

4 Claims, 6 Drawing Sheets

LAMINATED PIEZOELECTRIC ELEMENT INCLUDING ADHESIVE LAYERS HAVING SMALL THICKNESS AND HIGH ADHESIVE STRENGTH

CROSS-REFERENCE TO RELATED APPLICATION

This application is based on and claims priority from Japanese Patent Application No. 2007-56887, filed on Mar. 7, 2007, the content of which is hereby incorporated by reference in its entirety into this application.

BACKGROUND OF THE INVENTION

1. Technical Field of the Invention

The present invention relates to laminated piezoelectric elements for use in, for example, piezoelectric actuators of fuel injectors.

2. Description of the Related Art

In recent years, laminated piezoelectric elements have come to be used in piezoelectric actuators for the purpose of obtaining large actuating motions with low voltages. The laminated piezoelectric elements are generally formed by integrally firing a plurality of thin piezoelectric ceramic layers that are alternately laminated with a plurality of internal electrode layers. The number of piezoelectric ceramic layers in a laminated piezoelectric element is generally 100-700, and the thickness of the piezoelectric ceramic layers is generally 20-200 μm.

With such an integrally-fired structure, internal stress induced in a laminated piezoelectric element in a direction hindering the actuating motion created by the element increases with the number of piezoelectric ceramic layers in the element. An excessive internal stress will cause cracks to occur in the laminated piezoelectric element, thereby deteriorating the characteristics of the element (e.g., decreasing the amount of the actuating motion) and lowering the reliability of the element (e.g., causing a short circuit).

To solve the above problem, there has been developed a method according to which: a plurality of unit laminates are first formed separately, and then stacked and bonded together with an adhesive to form a laminated piezoelectric element. As the adhesive, a heat-curing silicone resin adhesive which contains a platinum catalyst is generally used.

However, the inventors of the present invention have found, through experimentation, a problem with the above method. More specifically, a laminated piezoelectric element made by the above method causes a greater loss in the actuating motion created by the element than that having the integrally-fired structure. Further, when used in a fuel injector, this loss will cause a loss in the displacement of an injection valve, resulting in a failure in the fuel injection of the fuel injector.

To effectively suppress the loss in the actuating motion, the adhesive layers, each of which is formed of the silicone resin adhesive between adjacent two of the unit laminates, are required to have a small thickness of, for example, 1 μm or less.

However, with the decrease in the thickness of the adhesive layers, the amount of the platinum catalyst in each of the adhesive layers is accordingly decreased. Consequently, when anticatalysts, such as sulfur, amine, and phosphorus, adhere to and react with the adhesive layers, the curing of the adhesive layers is degraded, causing the adhesive strength of those layers to be decreased.

Further, due to the decreased adhesive strength, it is impossible to ensure high reliability of the laminated piezoelectric element when the element is subject to a high temperature, for example 120° C. or higher, during its operation in a fuel injector.

SUMMARY OF THE INVENTION

The present invention has been made in view of the above-mentioned problems.

According to the present invention, there is provided a laminated piezoelectric element which includes a plurality of unit laminates and a plurality of adhesive layers. The unit laminates are stacked together. Each of the unit laminates includes a plurality of piezoelectric ceramic layers and a plurality of internal electrode layers that are alternately laminated with the piezoelectric ceramic layers in the lamination direction of the unit laminate. Each of the adhesive layers is formed between adjacent two of the unit laminates to bond the two unit laminates together. Further, each of the adhesive layers has a thickness of 1 μm or less and an adhesive strength of 1.3 MPa or higher.

With the above thickness of the adhesive layers, it is possible to minimize the loss in the actuating motion created by the piezoelectric ceramic layers due to the adhesive layers, thereby ensuring high accuracy of the laminated piezoelectric element.

With the above adhesive strength of the adhesive layers, it is possible to ensure high reliability of the laminated piezoelectric element even when the element is subject to a high temperature, for example 120° C. or higher. Moreover, it is also possible to prevent the adhesive layers from absorbing the actuating motion created by the piezoelectric ceramic layers, thereby further enhancing the accuracy of the laminated piezoelectric element.

According to a further implementation of the present invention, the adhesive layers are formed by curing a silicone resin adhesive that contains an organic peroxide.

With the above formation, it is possible to achieve such a high strength of the adhesive layers as 1.3 MPa or higher. More specifically, with the organic peroxide, the silicone resin adhesive can be sufficiently cured to form the adhesive layers even when there are anticatalysts, such as sulfur, amine, and phosphorus, in the vicinity of the adhesive.

The silicone resin adhesive may include a diorganopolysiloxane and an organohydrogenpolysiloxane as silicone rubber compositions. In this case, the diorganopolysiloxane serves as a base polymer and the organohydrogenpolysiloxane serves as a crosslinker. Further, diorganopolysiloxane may include at least two alkenyl groups, such as a vinyl group, an allyl group, a propenyl group, an isopropenyl group, a butenyl group, a hexenyl group, and a cyclohexenyl group.

The organic peroxide in the silicone resin adhesive functions as a catalyst for cross-linking the resin components of the adhesive through a radical reaction. Specific examples of the organic peroxide include ketone peroxides, hydroperoxides, diacyl peroxides, dialkyl peroxides, peroxyketals, alkyl peresters, and percarbonates. More specifically, di-tertiary butyl peroxide, dicumyl peroxide, diisopropylbenzene hydroperoxide, 1,3-bisbenzen, 1,1-di(t-butylperoxy)cyclohexane, or the like can be used as the organic peroxide, The amount of the organic peroxide in the silicone resin adhesive is preferably in a range of 0.01 to 10 parts by weight, more preferably in a range of 0.1 to 5 parts by weight, with respect to 100 parts by weight of the base polymer. If the amount of the organic peroxide is less than 0.01 parts by weight, the adhesive will not be sufficiently cured. On the contrary, if the amount of the organic peroxide is greater than 10 parts by weight, residue of the organic peroxide remains in the resultant adhesive layers. This residue will be decomposed with time, and may thereby cause the characteristics (e.g., the hardness) of the adhesive layers to be changed. As a result, it is impossible to ensure reliable operation of the laminated piezoelectric element.

Preferably, the silicone resin adhesive further includes a platinum group metal catalyst in addition to the organic peroxide.

With the platinum group metal catalyst, it is possible to further enhance the adhesive strength of the adhesive layers. More specifically, in some cases, the effect of the organic peroxide on the curing of the silicone resin adhesive may be decreased by oxygen. However, the use of both the organic peroxide and platinum group metal catalyst makes it possible to arrange the platinum group metal catalyst in the vicinity of the interface between the adhesive and air and arrange the organic peroxide inside the adhesive. With this arrangement, the curing of the adhesive can be further accelerated, resulting in a further increased adhesive strength of the adhesive layers.

Specific examples of the platinum group metal catalyst may include simple platinum group metals, such as platinum (including platinum black), rhodium, and palladium. In addition, the following may also be used as the platinum group metal catalyst: platinum chlorides, chloroplatinic acid and chloroplatinates, such as $H_2PtCl_4 \cdot nH_2O$, $H_2PtCl_6 \cdot nH_2O$, $NaHPtCl_6 \cdot H_2O$, $K_2PtCl_4 \cdot nH_2O$, $PtCl_4 \cdot nH_2O$, $PtCl_2$, and $Na_2HPtCl_4 \cdot nH_2O$ (here, n is 0 or an integer of 1-6, preferably 0 or 6), and alcohol-modified chloroplatinic acid (see U.S. Pat. No. 3,220,972); complexes of chloroplatinic acid and olefins (see U.S. Pat. No. 3,159,601, U.S. Pat. No. 3,159,662, and U.S. Pat. No. 3,775,452); platinum group metals (e.g., platinum black and palladium) supported by catalyst supporters (e.g., alumina, silica, and carbon); rhodium-olefin complexes; chlorotris(triphenylphosphine) rhodium (Wilkinson's catalyst); and complexes of platinum chlorides, chloroplatinic acid or chloroplatinates with siloxanes containing a vinyl group (in particular, cyclic siloxanes containing a vinyl group).

The amount of the platinum group metal catalyst in the silicone resin adhesive is preferably in a range of 0.1 to 1000 ppm, more preferably in a range of 0.1 to 500 ppm, further more preferably in a range of 0.5 to 200 ppm with respect to the resin components including the base polymer and crosslinker.

In addition, the silicone resin adhesive may further include some metals or metallic compounds. In this case, it is possible to further accelerate the decomposition reaction of the organic peroxide, thereby further accelerating the curing of the adhesive. Metals except alkali metals and alkaline earth metals, more particularly metals of group IB, group IIB, group VIIA, and group VIII, and compounds of those metals may be included in the silicone resin adhesive.

The adhesive layers of the laminated piezoelectric element also can be formed by curing an acrylic adhesive that contains an organic peroxide. Any known acrylic adhesive containing an organic peroxide can be used to form the adhesive layers.

It is preferable that the laminated piezoelectric element be used in a piezoelectric actuator of a fuel injector.

In the fuel injector, the laminated piezoelectric element will be subject to a high temperature, for example 120° C. or higher. However, since the adhesive layers have a thickness of 1 μm or less and an adhesive strength of 1.3 MPa or higher, it is still possible to ensure high accuracy and reliability of the laminated piezoelectric element in the high temperature environment. Accordingly, it is thus possible to ensure high accuracy and reliability of the entire fuel injector.

In the laminated piezoelectric element, the piezoelectric ceramic layers may be made of piezoelectric ceramics, such as PZT (lead zirconate titanate), and the internal electrode layers may be made of conductive metals.

BRIEF DESCRIPTION OF THE DRAWINGS

The present invention will be understood more fully from the detailed description given hereinafter and from the accompanying drawings of one preferred embodiment of the invention, which, however, should not be taken to limit the invention to the specific embodiment but are for the purpose of explanation and understanding only.

In the accompanying drawings.

DESCRIPTION OF PREFERRED EMBODIMENT

Figure 1:
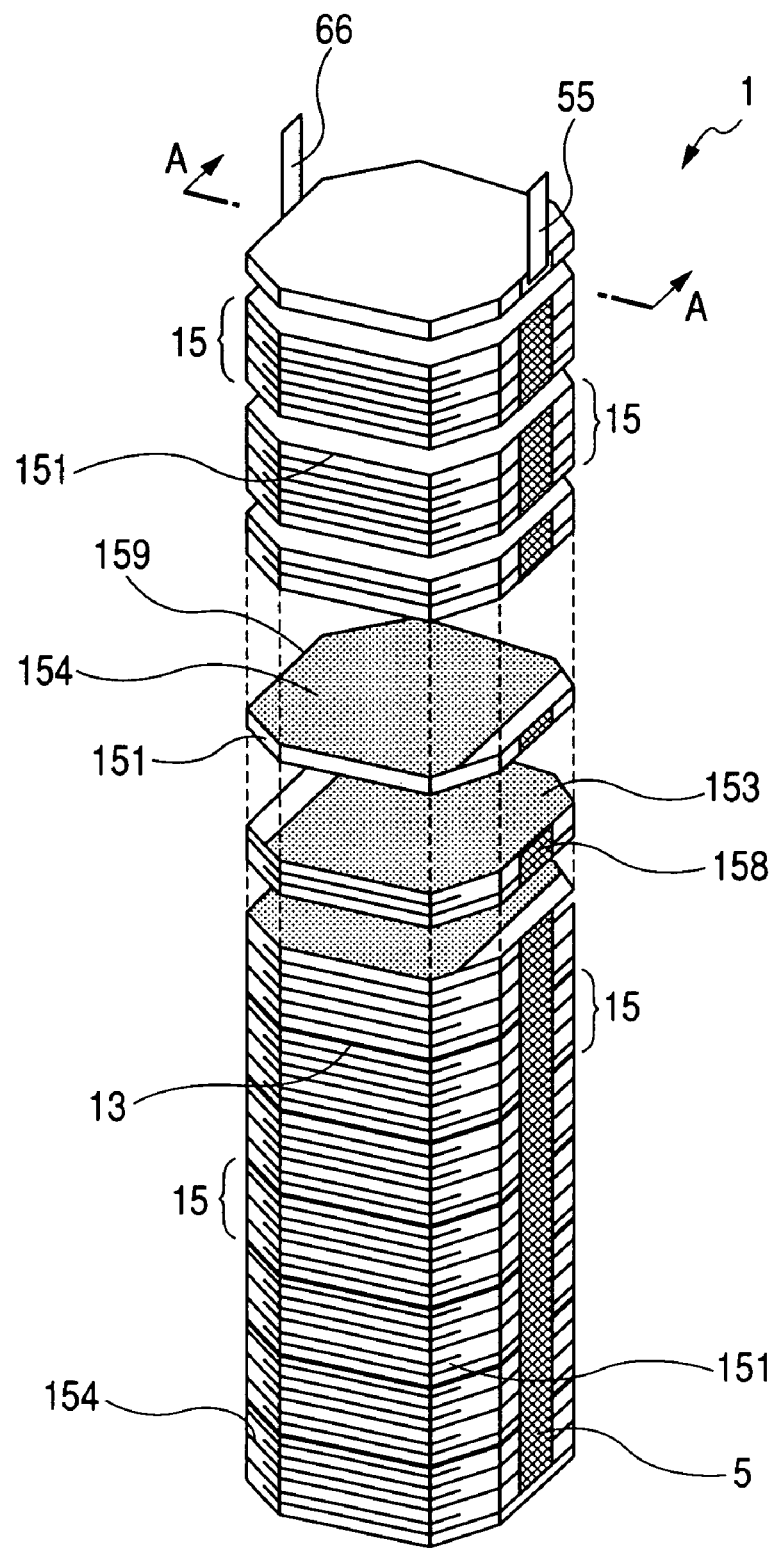
FIG. 1 is an exploded perspective view of a laminated piezoelectric element according to an embodiment of the invention.
Figure 2:
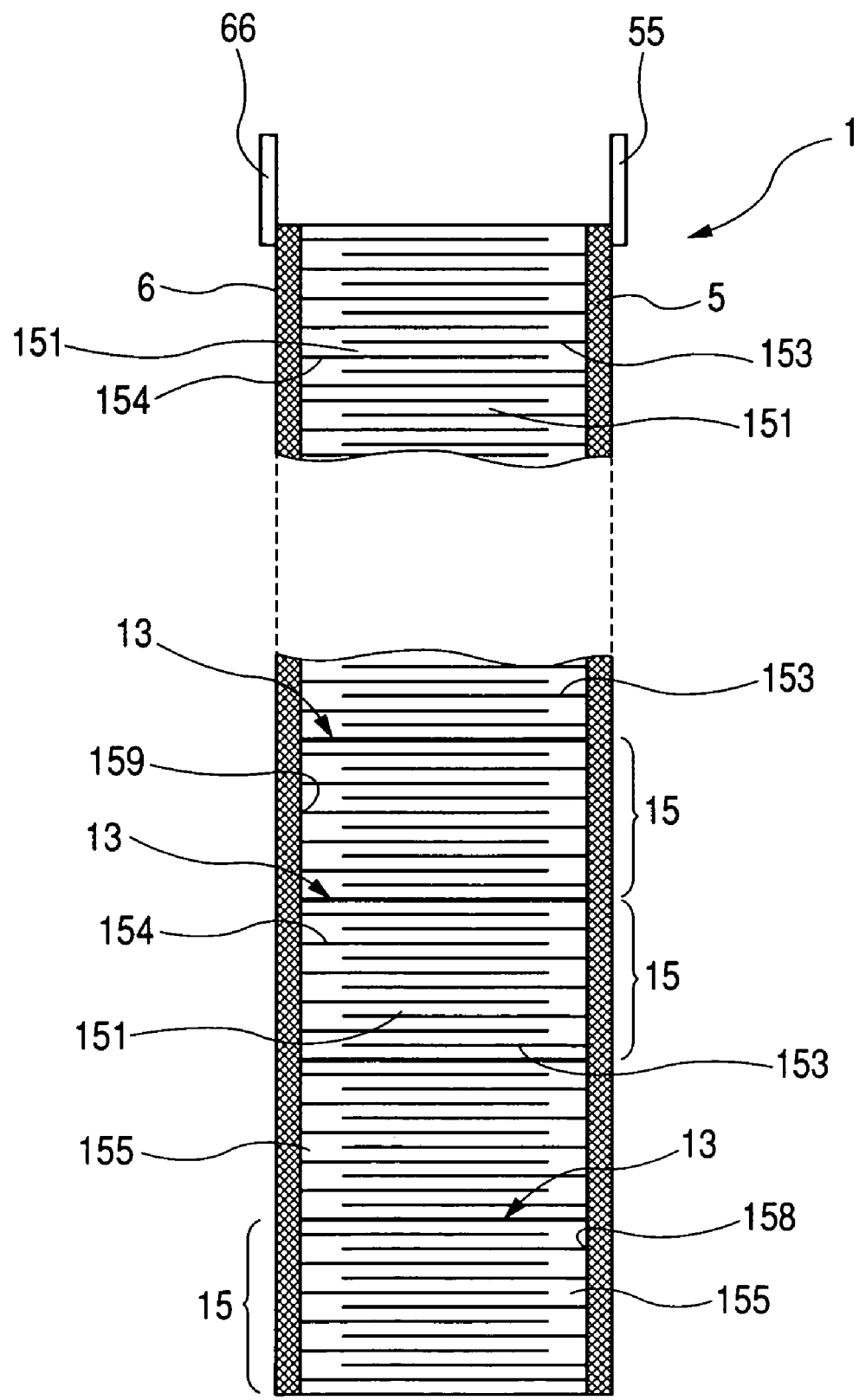
FIG. 2 is a cross-sectional view taken along the line A-A in FIG. 1.
Figure 3:
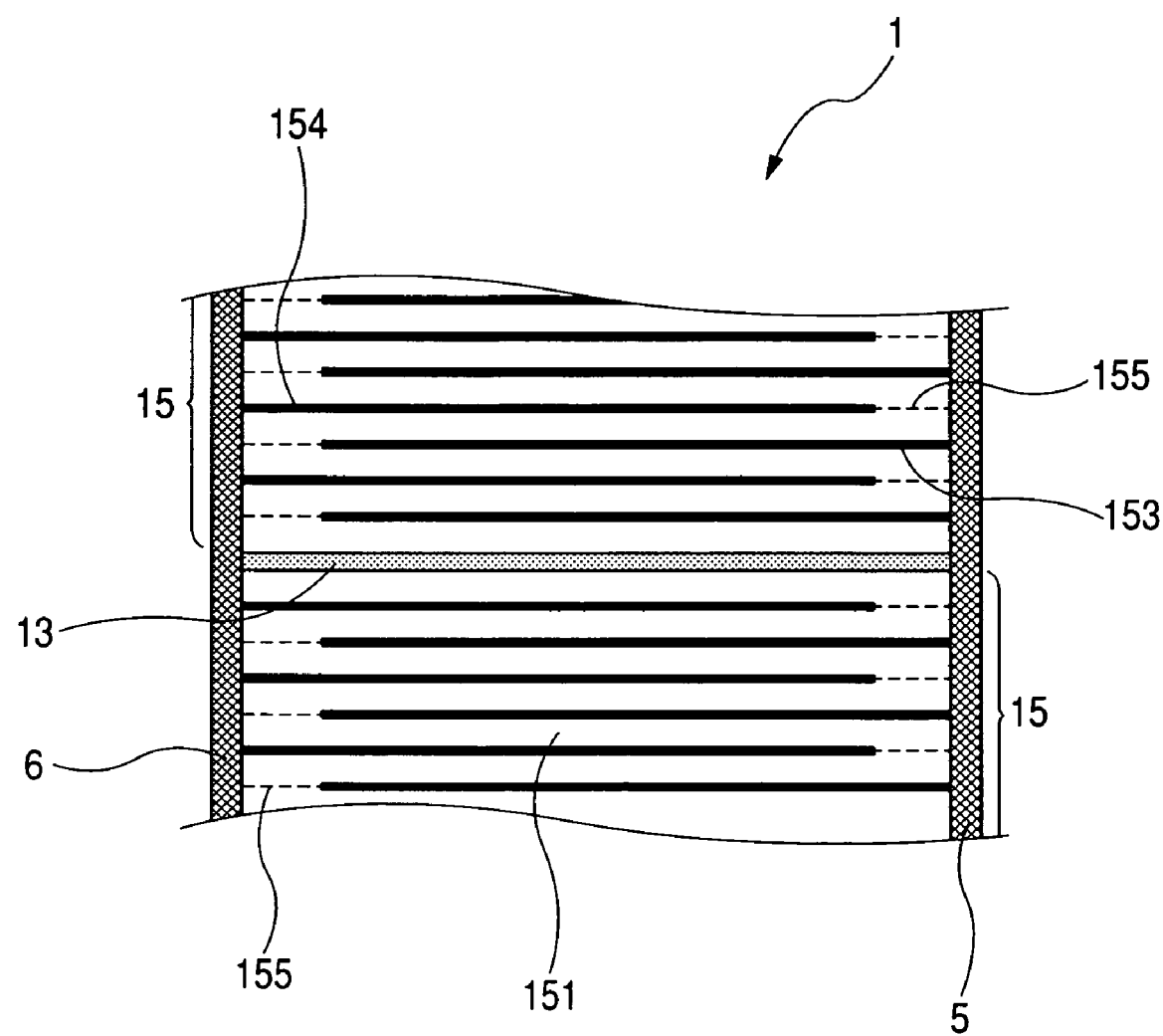
FIG. 3 is an enlarged cross-sectional view showing a part of FIG. 2.

FIGS. 1-3 show the overall structure of a laminated piezoelectric element 1 according to an embodiment of the present invention.

The laminated piezoelectric element 1 includes a plurality of unit laminates 15 that are stacked together, and a plurality of adhesive layers 13 each of which is formed between two adjacent unit laminates 15 to bond the two unit laminates 15 together. Each of the unit laminates 15 includes a plurality of piezoelectric ceramic layers 151 and a plurality of internal electrode layers 153 and 154 that are alternately laminated with the piezoelectric ceramic layers 151 in the lamination direction of the unit laminate 15. Each of the adhesive layers 13 has a thickness of 1 μm or less and an adhesive strength of 1.3 MPa or higher. Further, in the present embodiment, the adhesive layers 13 are formed by curing a silicone resin adhesive that contains an organic peroxide and a platinum group metal catalyst.

More specifically, in the present embodiment, each of the unit laminates 15 includes 23 piezoelectric ceramic layers 151. On the two opposite major surfaces of each of the ceramic layers 151, there are respectively provided one internal electrode layer 153 and one internal electrode layer 154. Further, each of the internal electrode layers 153 has a portion 158 exposed to a side surface of the unit laminate 15; each of the internal electrode layers 154 has a portion 159 exposed to another side surface of the unit laminate 15. The exposed portions 158 of the internal electrode layers 153 are alternately arranged with the exposed portions 159 of the internal electrode layers 154 in the lamination direction of the unit laminate 15. All the exposed portions 158 of the internal electrode layers 153 are connected to a side electrode 5, whereas all the exposed portions 159 of the internal electrode layers 154 are connected to a side electrode 6. Further, the internal electrode layers 153 and 154 partially cover the corresponding major surfaces of the ceramic layers 151, leaving uncovered portions 155 on the corresponding major surfaces.

Moreover, in the present embodiment, the laminated piezoelectric element 1 includes 25 unit laminates 15 that are stacked and bonded together with the adhesive layers 13.

The laminated piezoelectric element 1 according to the present embodiment can be made by a method which includes the following steps.

At the first step, powders of raw materials of PZT (lead zirconate titanate) are prepared. The raw materials include lead oxide, zirconia, titanium oxide, niobium oxide, and strontium carbonate. The powders are dry-mixed at predetermined ratios by means of a mixer, and the resultant mixture is then preliminarily fired at a temperature of 800-950° C.

At the second step, pure water and a dispersant are further added to the preliminarily-fired mixture to form a slurry. The slurry is then wet-milled by means of a media grinding mill. The wet-milled slurry is further dried, degreased, and mixed with a solvent, a binder, a plasticizer, and a dispersant by means of a ball mill. The obtained mixture is then defoamed and adjusted in viscosity in a vacuum while being agitated in the vacuum by an agitator. As a result, the final slurry is obtained.

At the third step, the final slurry is applied, by a doctor blade method, on a carrier film to form a green sheet of a given thickness. It should be appreciated that the green sheet also can be formed by other methods, for example an extrusion molding.

Figure 4:
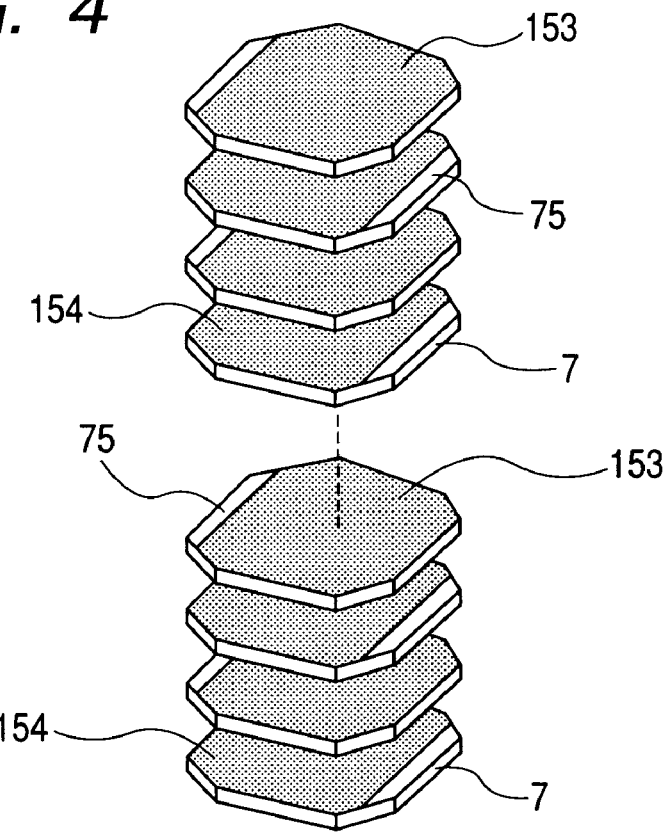
FIG. 4 is a perspective view illustrating a lamination process in manufacturing the laminated piezoelectric element.

At the fourth step, a paste of silver and palladium is applied on the green sheet in a specific pattern. Then, the green sheet is pressed by means of a pressing machine to form two groups of sheet pieces 7 having a given shape and size. The sheet pieces 7 of the first group each have either an internal electrode layer 153 or an internal electrode layer 154 formed thereon, as shown in FIG. 4. Additionally, on the surfaces of the first group sheet pieces 7, there are also left uncovered portions 75. On the other hand, the sheet pieces 7 of the second group each have neither internal electrode layer 153 nor 154 formed thereon.

At the fifth step, 21 of the sheet pieces 7 of the first group are laminated so that the right/left positions of the uncovered portions 75 of the sheet pieces 7 alternate in the lamination direction, as shown in FIG. 4. Then, two of the sheet pieces 7 of the second group further laminated respectively on and under the laminated sheet pieces 7 of the first group so as to cover the most outside internal electrode layers 153 and 154. As a result, an intermediate unit laminate is obtained.

Figure 5:
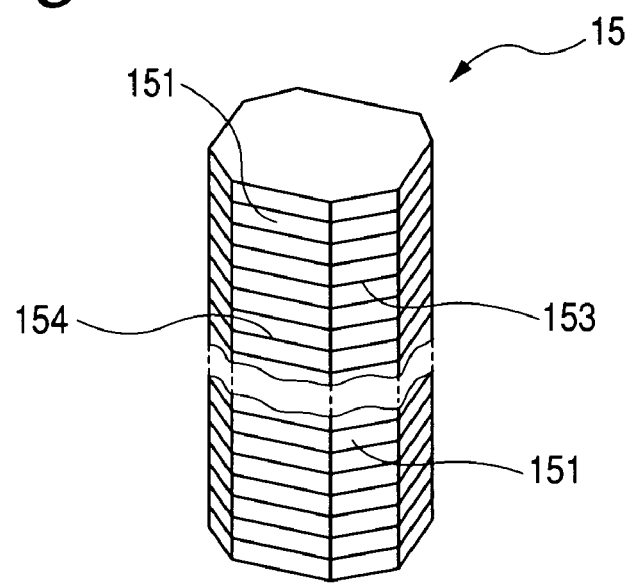
FIG. 5 is a perspective view showing a unit laminate of the laminated piezoelectric element.

At the sixth step, the intermediate unit laminate is heat-compressed, degreased, and fired at a temperature of 900-1200° C. Then, the intermediate unit laminate is further polished, forming a unit laminate 15 of a desired shape as shown in FIG. 5.

At the seventh step, an Ag paste is applied on both the right and left side surfaces of the unit laminate 15, and baked to form parts of the side electrodes 5 and 6.

At the eighth step, another 24 unit laminates 15 are further formed by repeating the above fifth to seventh steps.

At the ninth step, all the 25 unit laminates 15 are stacked and bonded together with the silicone resin adhesive that includes the organic peroxide and platinum group metal catalyst.

In the present embodiment, the silicone resin adhesive contains a linear organopolysiloxane, which contains a vinyl group, as a base polymer and organohydrogenpolysiloxane as a crosslinker. The silicone resin adhesive further contains 1,1-di(t-butylperoxy)cyclohexane as the organic peroxide and a toluene solution of a platinum-divinyl-tetramethyl-disiloxane-complex as the platinum group metal catalyst. Further, the silicone resin adhesive is so composed as to have an adhesive strength of 1.3 MPa or higher after being cured.

The silicone resin adhesive is applied between the unit laminates 15 and cured to form the adhesive layers 13. More specifically, the silicone resin adhesive is applied on the joining surfaces of the unit laminates 15 by means of a dispenser at a thickness of 1 μm or less. Then, all the unit laminates 15 are stacked together with the joining surfaces overlapping one another, and placed as a whole in a die. Then, the unit laminates 15 are compressed in the stacking direction and kept in the compressed state for 1 hour at 180° C. to cure the adhesive layers 130.

At the tenth step, referring again to FIGS. 1 and 2, external electrodes 55 and 66 made of stainless steel are respectively bonded to the side electrodes 5 and 6 with a conductive adhesive that contains an epoxy resin and 70% by weight Ag.

As a result, the laminated piezoelectric element 1 according to the present embodiment is obtained. The laminated piezoelectric element 1 has the following advantages.

In the laminated piezoelectric element 1, the adhesive layers 13 have a thickness of 1 μm or less.

With such a thickness, it is possible to minimize the loss in the actuating motion created by the piezoelectric ceramic layers 151 due to the adhesive layers 13, thereby ensuring high accuracy of the laminated piezoelectric element 1.

In addition, if the thickness of the adhesive layers 13 is above 1 μm, it will be difficult to effectively suppress the loss in the actuating motion. The thickness of the adhesive layers 13 can be measured, for example, by cutting the laminated piezoelectric element 1 in the lamination direction and observing the adhesive layers 13 on the cross-section using a SEM (Scanning Electron Microscope).

Further, the adhesive layers 13 have an adhesive strength of 1.3 MPa or higher.

With such an adhesive strength, it is possible to ensure high reliability of the laminated piezoelectric element 1 even when the element 1 is subject to a high temperature, for example 120° C. or higher. Moreover, it is also possible to prevent the adhesive layers 13 from absorbing the actuating motion created by the piezoelectric ceramic layers 151, thereby further enhancing the accuracy of the laminated piezoelectric element 1.

In addition, if the adhesive strength of the adhesive layers 13 is below 1.3 MPa, it will be difficult to prevent the adhesive layers 13 from absorbing the actuating motion and to ensure high reliability of the laminated piezoelectric element 1 in a high temperature environment. The adhesive strength of the adhesive layers 13 can be measured, for example, by applying stress to the adhesive layers 13 in a shearing direction (i.e., in a direction perpendicular to the lamination direction) and measuring the value of the stress when the element 1 comes to be broken. The measurement can be conducted by means of an Autograph made by Shimadzu Corporation, a tensile tester made by, for example, Instron Co., Ltd., or a push-pull gauge.

Figure 6:
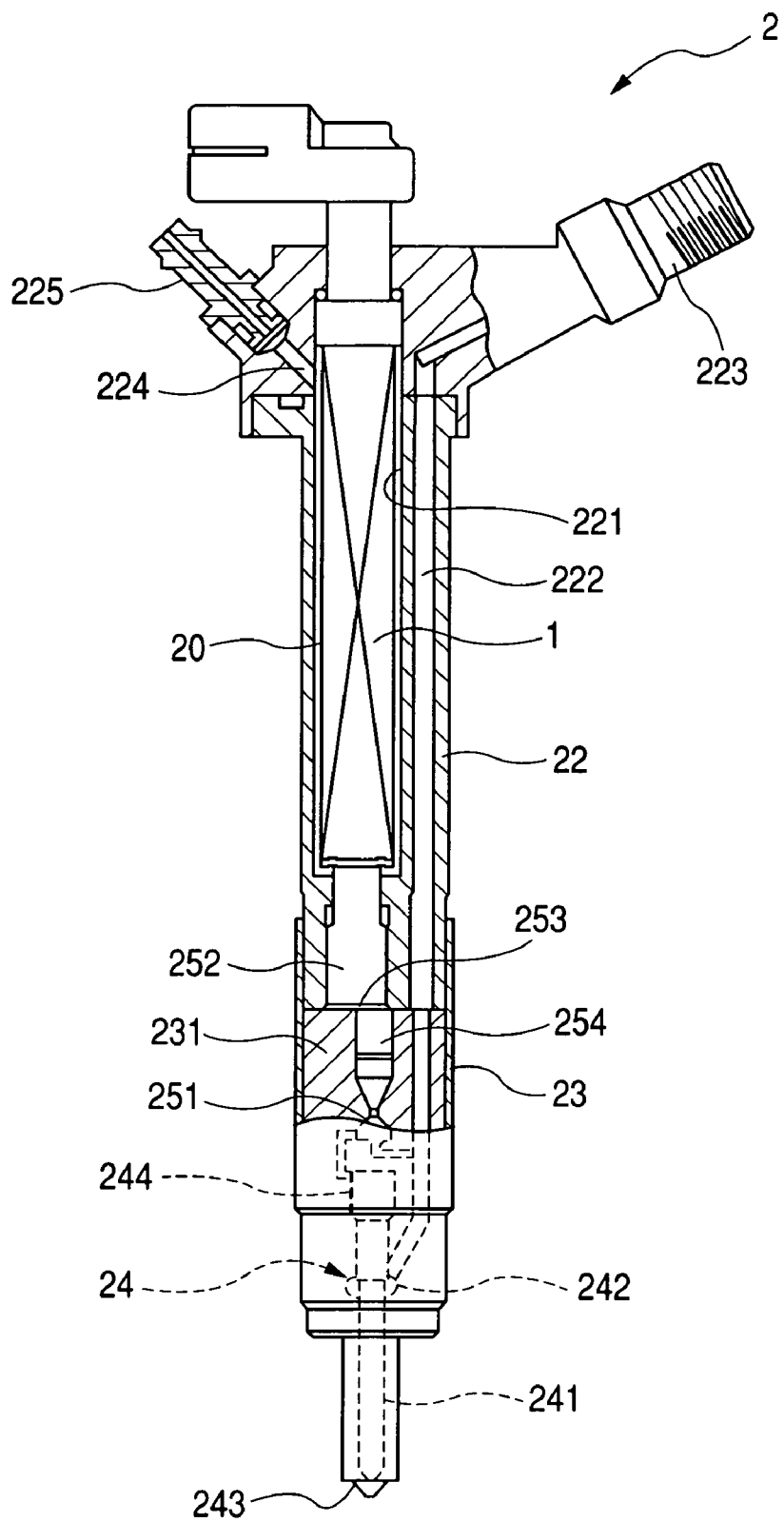
FIG. 6 is a partially cross-sectional view of a fuel injector in which the laminated piezoelectric element is incorporated.

FIG. 6 shows an overall structure of a fuel injector 2 in which the laminated piezoelectric element 1 according to the present embodiment is incorporated. The fuel injector 2 is used in a common rail fuel injection system for a diesel engine.

The fuel injector 2 includes an upper housing 22, in which the laminated piezoelectric element 1 is received, and a lower housing 23 that is fixed to a lower end of the upper housing 22 and has an injection nozzle portion 24 formed therein.

The upper housing 22 is substantially cylindrical in shape and has formed therein a longitudinal bore 221 that is offset from the longitudinal axis of the upper housing 22. In the longitudinal bore 221, there is inserted and fixed the laminated piezoelectric element 1.

A fuel supply passage 222, which serves to supply high-pressure fuel from a common rail (not shown) to the injection nozzle portion 24, is formed in the upper housing 22 in parallel with the longitudinal bore 221. The fuel supply passage 222 communicates with the common rail via a fuel introduction pipe 223 that protrudes up and rightward from an upper end portion of the upper housing 22.

A fuel drain passage 224, which serves to drain out the fuel that remains in the fuel injector 2 after each fuel injection, is also formed in the upper housing 22 in fluidic communication with the longitudinal bore 221. The remaining fuel is returned from the fuel drain passage 224 to a fuel tank (not shown) via a fuel drain pipe 225 that protrudes up and leftward from the upper end portion of the upper housing 22.

The fuel drain passage 224 communicates with a three-way valve 251 (to be described in detail latter) through an annular gap 20 formed between the longitudinal bore 221 and the laminated piezoelectric element 1 and an intermediate fuel passage (not shown). The intermediate fuel passage extends from the annular gap 20 downward through both the upper and lower housings 22 and 23.

The injection nozzle portion 24 includes a nozzle needle 241, a fuel reservoir 242, and an injection hole 243. The nozzle needle 241 is vertically slidable in a piston body 231. The fuel reservoir 242 is provided to reserve the high-pressure fuel supplied from the fuel supply passage 222. More specifically, the fuel reservoir 242 is formed around a central portion of the nozzle needle 241 and has a lower end of the fuel supply passage 222 opening thereto.

The injection hole 243 is opened and closed by the nozzle needle 241, thereby selectively injecting the high-pressure fuel supplied from the fuel reservoir 242 into a cylinder of the engine. More specifically, the nozzle needle 241 receives both a fuel pressure from the fuel reservoir 242 in a valve-opening direction (i.e., upward direction in FIG. 6) and a fuel pressure from a back pressure chamber 244 in a valve-closing direction (i.e., the downward direction in FIG. 6); the back pressure chamber 244 is located vertically upward of the nozzle needle 241. When the fuel pressure in the back pressure chamber 244 drops, the nozzle needle 241 is lifted upward, thereby opening the injection hole 243 to inject the high-pressure fuel into the engine cylinder.

The fuel pressure in the back pressure chamber 244 is controlled by the three-way valve 251 that communicates with the back pressure chamber 244 and selectively with either the fuel supply passage 222 or the fuel drain passage 224. More specifically, the three-way valve 251 includes a spherical valve member. This valve member is actuated by the laminated piezoelectric element 1, via a large-diameter piston 252, a hydraulic chamber 253, and a small-diameter piston 254, to selectively open and close ports that communicate with either the fuel supply passage 222 or the longitudinal bore 221.

As described above, the laminated piezoelectric element 1 is disposed in the longitudinal bore 221 which is filled with high temperature fuel. In other words, the laminated piezoelectric element 1 is subject to a high temperature in the fuel injector 2. However, since the adhesive layers 13 have a thickness of 1 μm or less and an adhesive strength of 1.3 MPa or higher, it is still possible to ensure high accuracy and reliability of the laminated piezoelectric element 1 in such a high temperature environment. Accordingly, it is thus possible to ensure high accuracy and reliability of the entire fuel injector 2.

Experiment 1

This experiment has been conducted to determine the effect of the composition of the silicone resin adhesive used to form the adhesive layers 13 of the laminated piezoelectric element 1.

A first piezoelectric stack of type A1 was formed by stacking two unit laminates 15 as described in the previous embodiment and bonding the two unit laminates 15 with a silicone resin adhesive X.

More specifically, the silicone resin adhesive X had the same composition as the silicone resin adhesive according to the previous embodiment except for the absence of any organic peroxide in the adhesive X. That is, the adhesive X contained the linear organopolysiloxane containing the vinyl group as a base polymer and organohydrogenpolysiloxane as a crosslinker. The adhesive X further contained the toluene solution of the platinum-divinyl-tetramethyl-disiloxane-complex as the platinum group metal catalyst. Before applying the adhesive X, an an catalyst (i.e., sulfur in this case) was made to adhere to the joining surfaces of the unit laminates 15 by making a vulcanized product (e.g., a fingerstall) contact with those joining surfaces. Then, the adhesive X was applied to the joining surfaces of the unit laminates 15, and the unit laminates 15 were stacked together with the joining surfaces overlapping with each other. After that, the adhesive X was cured in the manner as described in the previous embodiment. As a result, the first piezoelectric stack of type A1 was obtained, where the adhesive layer 13 formed between the two unit laminates 15 had a thickness of 1 μm or less.

The first piezoelectric stack of type A1 was then tested to determine the adhesive strength of the adhesive layer 13.

Figure 7:
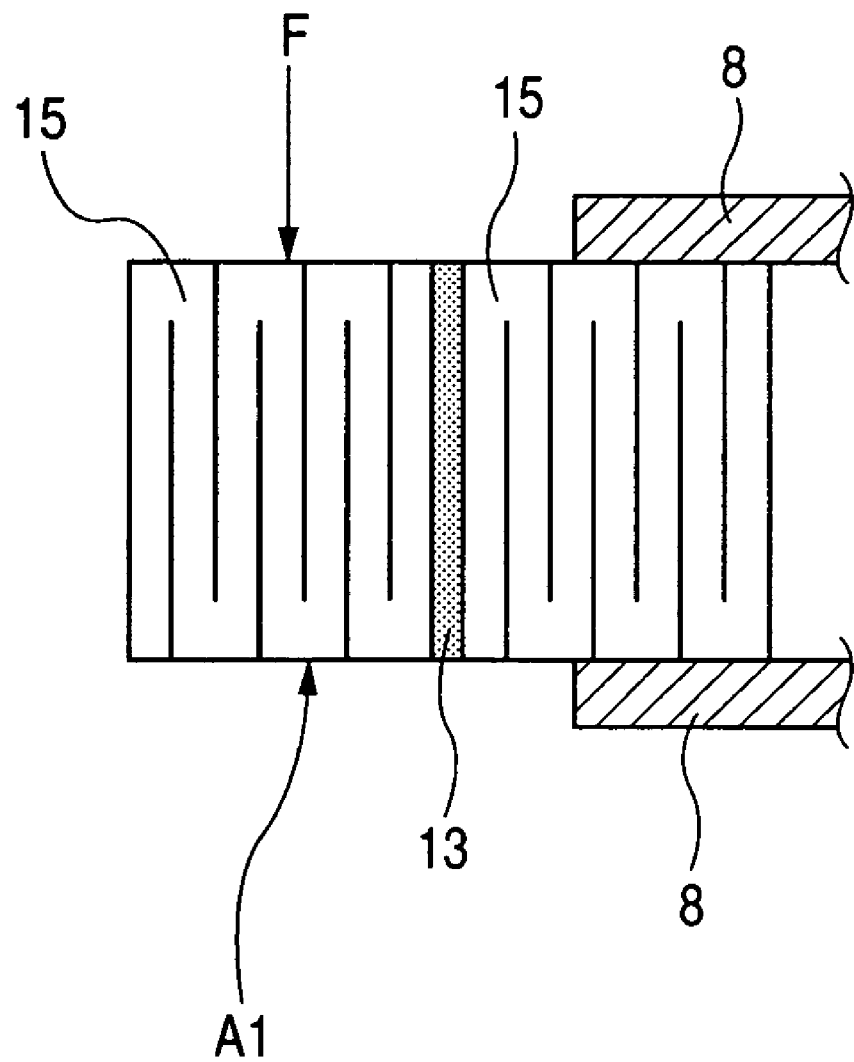
FIG. 7 is a schematic view illustrating an adhesive strength measurement method used in the experiments of the invention.

More specifically, as shown in FIG. 7, the first piezoelectric stack of type A1 was fixed with a jig 8, and a force F was gradually applied to the stack in a direction perpendicular to the lamination direction of the stack until the two unit laminates 15 of the stack were separated. The stress when the two unit laminates 15 came to be separated was measured as the adhesive strength for type A1.

Further, a second piezoelectric stack of type A1 was formed in the same way as the above first piezoelectric stack. Then, the second piezoelectric stack of type A1 was placed in an environment of 120° C., and electric voltage was repeatedly applied across the side electrodes 5 and 6 of the second stack. After that, it was observed whether cracks had occurred in the side electrodes 5 and 6 due to insufficient adhesive strength of the adhesive layer 13.

Moreover, piezoelectric stacks of type A2 were also formed with the silicone resin adhesive X and in the same way as those of type A1 except for that no anticatalyst was made to adhere to the joining surfaces of the unit laminates 15 in forming the stacks of type A2. The piezoelectric stacks of type A2 were then tested in the same way as those of type A1.

Furthermore, piezoelectric stacks of type A3 were formed with a silicone resin adhesive Y and in the same way as those of type A1. The adhesive Y had the same composition as the silicone resin adhesive according to the previous embodiment. That is, the adhesive Y contained the linear organopolysiloxane containing the vinyl group as a base polymer, the organohydrogenpolysiloxane as a crosslinker, 1,1-di(t-butylperoxy)cyclohexane as the organic peroxide, and the toluene solution of the platinum-divinyl-tetramethyl-disiloxanecomplex as the platinum group metal catalyst. The piezoelectric stacks of type A3 were then tested in the same way as those of type A1.

After that, piezoelectric stacks of type A4 were also formed with the silicone resin adhesive Y and in the same way as those of type A1 except for that no anticatalyst was made to adhere to the joining surfaces of the unit laminates 15 in making the stacks of type A4. The piezoelectric stacks of type A4 were then tested in the same way as those of type A1.

TABLE 1 shows all the test results for the piezoelectric stacks of types A1-A4, where O.P., P.G.M.C., and A.S. are respectively abbreviations of Organic Peroxide, Platinum Group Metal Catalyst, and Adhesive Strength.

TABLE 1

| Stack Type | Adhesive Type | O.P. | P.G.M.C. | Anti-catalyst | A.S. (MPa) | Cracks |
|---|---|---|---|---|---|---|
| A1 | X | Without | With | With | 0 | Occurred |
| A2 | X | Without | With | Without | 1 | Occurred |
| A3 | Y | With | With | With | 1.5 | No |
| A4 | Y | With | With | Without | 5 | No |

As can be seen from TABLE 1, the piezoelectric stacks of types A3 and A4, which were made with the adhesive Y (i.e., the silicone resin adhesive according to the previous embodiment), exhibited a high adhesive strength of 1.5 or 5 MPa, and could withstand the repeated application of electric voltage without causing any cracks. On the contrary, the piezoelectric stacks of types A1 and A2, which were made with the adhesive X that contained the platinum group metal catalyst but no organic peroxide, had a low adhesive strength of 1 MPa or lower, and could not withstand the repeated application of electric voltage to cause cracks. Further, for the piezoelectric stacks of type A1, the adhesive X could be hardly cured with the anticatalyst, so that the adhesive strength of the resultant adhesive layers 13 was almost zero.

In addition, though not explicitly shown in TABLE 1, it has also been experimentally confirmed that to ensure high accuracy and reliability of the laminated piezoelectric element 1 at a temperature of 120° C. or higher, the adhesive layers 13 preferably have an adhesive strength of 1.3 MPa or higher.

Experiment 2

This experiment has been conducted to determine the effects of different catalysts in the silicone resin adhesive used to form the adhesive layers 13 of the laminated piezoelectric element 1.

In the experiment, three different silicone resin adhesives X, Y, and Z were used. The adhesive X was the same as that used in the previous experiment 1, and thus contained, as a catalyst, only the platinum group metal catalyst. On the contrary, the adhesive Z contained, as a catalyst, only the organic peroxide. In comparison, the adhesive Y was the same as the silicone resin adhesive according to the previous embodiment, and thus contained both the platinum group metal catalyst and the organic peroxide.

For each of the three adhesives X, Y, and Z, three piezoelectric stacks were made with the adhesive in the same way as in the previous experiment 1 without the step of making an anticatalyst adhere to the joining surfaces of the unit laminates 15. Then, each of all the nine piezoelectric stacks was tested in the same way as in the previous experiment 1 to determine the adhesive strength of the adhesive layer 13 formed therein.

TABLE 2 shows all the test results for the three adhesives X, Y, and Z, where the adhesive strength for each of the three adhesives represents the average of the adhesive strengths of the adhesive layers 13 in the three piezoelectric stacks made with the adhesive. In addition, in TABLE 2, P.G.M.C. and O.P. are respectively abbreviations of Platinum Group Metal Catalyst and Organic Peroxide.

TABLE 2

| Adhesive Type | Catalyst | Adhesive Strength (MPa) |
|---|---|---|
| X | P.G.M.C. | 0.8 |
| Y | P.G.M.C. + O.P. | 4 |
| Z | O.P. | 2.8 |

As can be seen from TABLE 2, the adhesive strength for the adhesive X was 0.8, which is lower than 1.3 MPa necessary for ensuring high accuracy and reliability of the laminated piezoelectric element 1. In comparison, the adhesive strength for the adhesive Z was 2.8 MPa, which is much higher than 1.3 MPa. Further, the adhesive strength for the adhesive Y was 4, which is remarkably higher than 1.3 MPa.

While the above particular embodiment and experimental results of the present invention have been shown and described, it will be understood by those skilled in the art that various modifications, changes, and improvements may be made without departing from the spirit of the invention.

Such modifications, changes, and improvements are possible within the scope of the appended claims.

What is claimed is:

1. A laminated piezoelectric element comprising:
    a plurality of unit laminates that are stacked together, each of the unit laminates including a plurality of piezoelectric ceramic layers and a plurality of internal electrode layers that are alternately laminated with the piezoelectric ceramic layers in a lamination direction of the unit laminate, and
    a plurality of adhesive layers each of which is formed between adjacent two of the unit laminates to bond the two unit laminates together,
    wherein each of the adhesive layers has a thickness of 1 μm or less and an adhesive strength of 1.3 MPa or higher, and
    each of the adhesive layers is made up of a silicone resin adhesive that contains an organic peroxide in a range of 0.01 to 10 parts by weight and is cured between the adjacent two laminates.

2. The laminated piezoelectric element as set forth in claim 1, wherein the silicone resin adhesive further comprises a platinum group metal catalyst.

3. The laminated piezoelectric element as set forth in claim 1, wherein the laminated piezoelectric element is used in a piezoelectric actuator of a fuel injector.

4. The laminated piezoelectric element as set forth in claim 1, wherein the silicone resin adhesive contains the organic peroxide in a range of 0.1 to 5 parts by weight.

* * * * *